(12) United States Patent
Ullrich et al.

(10) Patent No.: US 12,736,629 B2
(45) Date of Patent: Sep. 15, 2026

(54) LASER SCANNER

(71) Applicant: RIEGL Laser Measurement Systems GmbH, Horn (AT)

(72) Inventors: Andreas Ullrich, Gablitz (AT); Rainer Reichert, Horn (AT)

(73) Assignee: RIEGEL Laser Measurement Systems GmbH, Horn (AT)

( * ) Notice: Subject to any disclaimer, the term of this patent is extended or adjusted under 35 U.S.C. 154(b) by 860 days.

(21) Appl. No.: 18/102,430

(22) Filed: Jan. 27, 2023

(65) Prior Publication Data

US 2023/0251353 A1 Aug. 10, 2023

(30) Foreign Application Priority Data

Feb. 7, 2022 (EP) .................................... 22155407

(51) Int. Cl.
*G01S 7/481* (2006.01)
*G01S 17/26* (2020.01)
*G01S 17/89* (2020.01)
*G02B 3/08* (2006.01)
(Continued)

(52) U.S. Cl.
CPC ............ *G01S 7/4813* (2013.01); *G01S 17/26* (2020.01); *G01S 17/89* (2013.01); *G02B 3/08* (2013.01); *G02B 5/09* (2013.01); *H05K 7/2039* (2013.01)

(58) Field of Classification Search
None
See application file for complete search history.

(56) References Cited

U.S. PATENT DOCUMENTS 3,996,476 A * 12/1976 Lazzara ............... G01N 21/474 250/221
10,324,170 B1 * 6/2019 Engberg, Jr. .......... G01S 7/4818
11,977,185 B1 * 5/2024 Wang ...................... G01S 17/10
(Continued)

FOREIGN PATENT DOCUMENTS

CA 2950937 A1 6/2017
DE 102004050682 A1 * 6/2005 ............. G02B 26/12
(Continued)

OTHER PUBLICATIONS

WO-2021210954 (Year: 2021).*
European Search Report corresponding to Application No. 22155407.4-1206, dated Jul. 11, 2022.

*Primary Examiner* — Shawn Decenzo
(74) *Attorney, Agent, or Firm* — Hoffmann & Baron, LLP

(57) ABSTRACT

A laser scanner for scanning of an environment, comprising a laser transmitter for transmitting a transmission beam, a laser receiver for receiving the transmission beam reflected by the environment as a receive beam, a beam-deflection device arranged in the beam path of the transmission and receive beams in the form of a mirror pyramid that is rotatable about a rotational axis, and an elongated housing comprising a bottom face, a top face, and a lateral shell which connects said faces, a window for the transmission and receive beams being in the bottom face, wherein the beam-deflection device is adjacent to the window and has a rotational axis oriented in parallel with the bottom face, the laser receiver being arranged close to the top face, and a deflecting mirror being arranged beside the bottom face and deflecting the receive beam from the beam-deflection device onto the laser receiver.

9 Claims, 2 Drawing Sheets

(51) Int. Cl.
*G02B 5/09* (2006.01)
*H05K 7/20* (2006.01)

(56) References Cited

U.S. PATENT DOCUMENTS

| | | | | |
|---|---|---|---|---|
| 2008/0151218 | A1* | 6/2008 | Mack | G01S 7/497<br>356/5.01 |
| 2010/0097598 | A1* | 4/2010 | Shin | G02B 3/00<br>356/5.01 |
| 2013/0010307 | A1* | 1/2013 | Greiner | G01S 7/4813<br>356/601 |
| 2018/0275251 | A1* | 9/2018 | Choi | G01S 17/10 |
| 2019/0310351 | A1* | 10/2019 | Hughes | G02B 26/101 |
| 2021/0063093 | A1* | 3/2021 | Tobiassen | G01S 17/88 |
| 2021/0364605 | A1* | 11/2021 | Demers | G01S 17/931 |
| 2022/0299608 | A1* | 9/2022 | Allouis | G01S 7/4813 |
| 2022/0299609 | A1* | 9/2022 | Reichert | H10F 77/959 |
| 2025/0155690 | A1* | 5/2025 | Li | G01S 7/4812 |

FOREIGN PATENT DOCUMENTS

| | | | | | |
|---|---|---|---|---|---|
| EP | 3182159 | A1 | | 6/2017 | |
| EP | 3447521 | A1 | | 2/2019 | |
| WO | WO-2017183145 | A1 | * | 10/2017 | G01S 7/4817 |
| WO | 2019064062 | A1 | | 4/2019 | |
| WO | WO-2021210954 | A1 | * | 10/2021 | G02B 5/09 |

* cited by examiner

LASER SCANNER

CROSS-REFERENCE TO RELATED APPLICATIONS

This application claims priority to the European Patent Application No. 22 155 407.4 filed Feb. 7, 2022 the disclosure of which is incorporated herein by reference.

TECHNICAL FIELD

The present disclosed subject matter relates to a laser scanner for scanning, in particular airborne scanning, of an environment.

BACKGROUND

A laser scanner for this purpose often comprises a laser transmitter for transmitting a transmission beam, a laser receiver for receiving the transmission beam reflected by the environment as a receive beam, a beam-deflection device arranged in the beam path of the transmission and receive beams in the form of a mirror pyramid that is rotatable about a rotational axis and has pyramid sides inclined relative to the rotational axis that each form a mirror facet, and a housing, in which the laser transmitter, the laser receiver, and the beam-deflection device are arranged.

A laser scanner of this kind is in particular used for mobile laser scanning and, for this purpose, is mounted on or in a vehicle, in particular an aircraft, or is mounted in an in particular movement-stabilizing platform specially provided for this purpose, which is in turn fastened to the vehicle. During the scanning, the transmission beam directed toward the rotating beam-deflection device is periodically pivoted over a scanning angle range and is thus fanned out to form a fan-shaped scanning beam which scans the environment line by line in approximately parallel scan lines. Laser scanners of this kind make it possible to scan the environment more uniformly than those laser scanners which refract the transmission beam into a scan cone by means of a rotating Risley prism, for example, and thus scan the environment in a spiral-shaped manner during mobile use. The same mirror facet of the beam-deflection device that deflects the transmission beam in each case also deflects the receive beam reflected by the environment and incoming from the same direction onto the laser receiver. The position of each scanned point in the environment relative to the laser scanner is determined from the transmission direction of the transmission beam and the propagation time until the receive beam is received, and, for example, a 3D model of the environment is created from a plurality of such scanned points. Laser scanners of this type are known from EP 3 182 159 A1, for example.

The housing facilitates the mounting in loading bays provided for this purpose or on mounting brackets of different vehicles and facilitates the dismounting if the vehicle is changed. An aperture, e.g. a hatch in the outer wall or the like, is provided in the outer wall of the vehicle or platform for the transmission and receive beams to pass through. On one hand, the aperture is intended to be small so that it impairs the structure of the outer wall and the air flow as little as possible, and on the other hand there is sometimes the need for further measuring and recording apparatuses, e.g. cameras, etc., to use the same aperture for simultaneously measuring the environment. These measuring apparatuses then have additional space requirements in the loading bay or on the mounting bracket besides the laser scanner without the aperture being intended to be enlarged.

BRIEF SUMMARY

The object of the disclosed subject matter is to provide a particularly compact laser scanner which allows for a particularly small aperture and/or allows additional measuring apparatuses to be arranged at the same aperture.

This object is achieved by a laser scanner for scanning, in particular airborne scanning, of an environment, which laser scanner comprises a laser transmitter for transmitting a transmission beam, a laser receiver for receiving the transmission beam reflected by the environment as a receive beam, a beam-deflection device arranged in the beam path of the transmission and receive beams in the form of a mirror pyramid that is rotatable about a rotational axis and has pyramid sides inclined relative to the rotational axis that each form a mirror facet, and a housing, in which the laser transmitter, the laser receiver, and the beam-deflection device are arranged and which comprises a bottom face and a top face, a lateral shell which connects the bottom face and top face and has an inner width that is less than the housing height between the bottom face and top face, and a window for the transmission and receive beams, wherein the window is in the bottom face, the beam-deflection device is adjacent to the window and its rotational axis is oriented substantially in parallel with the bottom face, and the laser receiver is arranged closer to the top face than to the bottom face, a deflecting mirror being arranged in the housing so as to be adjacent to the bottom face and deflecting the receive beam from the beam-deflection device onto the laser receiver.

Since the thus elongated laser scanner has its window in the bottom face rather than in the lateral shell of the housing, it can be mounted upright behind the aperture. The beam-deflection device and the deflecting mirror together achieve compact, Z-shaped folding of the beam path. This folding makes it possible to optimize the ratio between the bottom face of the housing and the face effective for receiving the receive beam, i.e. the smaller of the two faces, the mirror facet face or window face, in the beam path, and therefore to maximize the effective receiving face with a given bottom face and to minimize the bottom face with a given effective receiving face, or a mixture thereof. In view of the rotational axis of the beam-deflection device that is substantially parallel to the bottom face and the laser receiver arranged closer to the top face, a deflecting angle of the deflecting mirror is approximately 90°, which allows for a particularly small bottom face of the housing. In principle, this is only dependent on the beam-deflection device and the deflecting mirror. For instance, the aperture in the outer wall of the vehicle can be kept small and/or remains beside the laser scanner or around this free space for use by additional measuring or recording apparatuses which measure the same environment synchronously with the laser scanner through the aperture.

In conjunction with the present laser scanner, "substantially in parallel with the bottom face" means that, on one hand, the bottom surface could only be planar in portions, with the rotational axis only being parallel to one of the portions of the bottom surface, and, on the other hand, that the rotational axis can optionally have a slight inclination relative to the bottom face or its portions in the order of a few angular degrees.

It is particularly advantageous here if the transmission beam impinges on the beam-deflection device in parallel with the rotational axis. This results in largely straight, parallel scan lines.

In an advantageous embodiment of the laser scanner, an optical receiving system is arranged in the housing in the beam path between the beam-deflection device and the laser receiver to focus the receive beam on the laser receiver. This makes it possible to use a smaller light sensor for the laser receiver while the field of view of the laser scanner remains unchanged and facilitates a smaller structure of the laser scanner overall.

In this case, the optical receiving system is optionally arranged between the deflecting mirror and the laser receiver. Since the space between the deflecting mirror and the beam-deflection device remains free as a result, these two components can be arranged closer to one another and the bottom face of the housing can be reduced in size as a further result.

The optical receiving system can be a reflective, diffractive, or refractive optical system, as known from the prior art. It is advantageous when the optical receiving system is an optical lens having a decentralized optical axis. Such a component has a compact structure. The laser receiver and its light sensor cannot be arranged centrally above the optical receiving system or the deflecting mirror owing to the decentralized optical axis, but instead is arranged in the optical axis, i.e. eccentrically, in particular close to the lateral shell of the housing, such that the remaining space in the interior of the housing can be better utilized.

In this case, it is particularly advantageous for the deflecting mirror to also deflect the transmission beam from the laser transmitter onto the beam-deflection device, the optical lens having a cut-out, which is in parallel with said optical axis and spaced apart therefrom, for the transmission beam to pass through. Owing to the transmission beam being guided in parallel with the optical axis and the overall Z-shaped folding by means of the deflecting mirror, the laser scanner, laser receiver, and beam path are combined in a particularly compact manner, which allows for a particularly small structure of the laser scanner. This is all the more applicable if, when viewed from the deflecting mirror, the laser transmitter is arranged on the top face behind the laser receiver, and in the process, the transmission beam is guided from the laser transmitter, past the laser receiver, and to the cut-out by means of an optical waveguide.

In an advantageous variant of the laser scanner, when viewed in the direction of the rotational axis, the window has the cross section of an arc of a circle or an arc of an ellipse, or of an open polygon, in the interior of which the rotational axis is positioned. Therefore, the window has a concave side, on which the beam-deflection device is arranged. In this variant, the mirror pyramid can project at least in part between lateral legs of the polygon or the ends of the arc of the circle or the arc of the ellipse. Even when the laser scanner has a narrow structure, this results in the respectively active mirror facet being utilized better than a planar window, i.e. the mirror facet that is currently in the beam path of the transmission and receive beams in that the entire face of this mirror facet is utilized for the receive beam.

It is also advantageous for the mirror facets to each have inclinations relative to the rotational axis that are different from one another. The environment is therefore scanned in a plurality of scan lines that are approximately parallel to one another.

In order to dissipate any potential heat from the housing without enlarging the bottom face of the housing, the housing optionally has a cooling body on the outside of its top face. As a result, trapped heat in the top region of the housing, for example, is reliably conducted away via the top face. The option of attaching further sensors directly to the housing is not limited by excessive waste heat from the housing. Furthermore, when the laser transmitter is arranged on the top face, the waste heat therefrom can be directly conducted away.

BRIEF DESCRIPTION OF THE DRAWINGS

The disclosed subject matter will be explained in greater detail in the following with reference to an embodiment shown in the accompanying drawings, in which.

DETAILED DESCRIPTION

Figure 1:
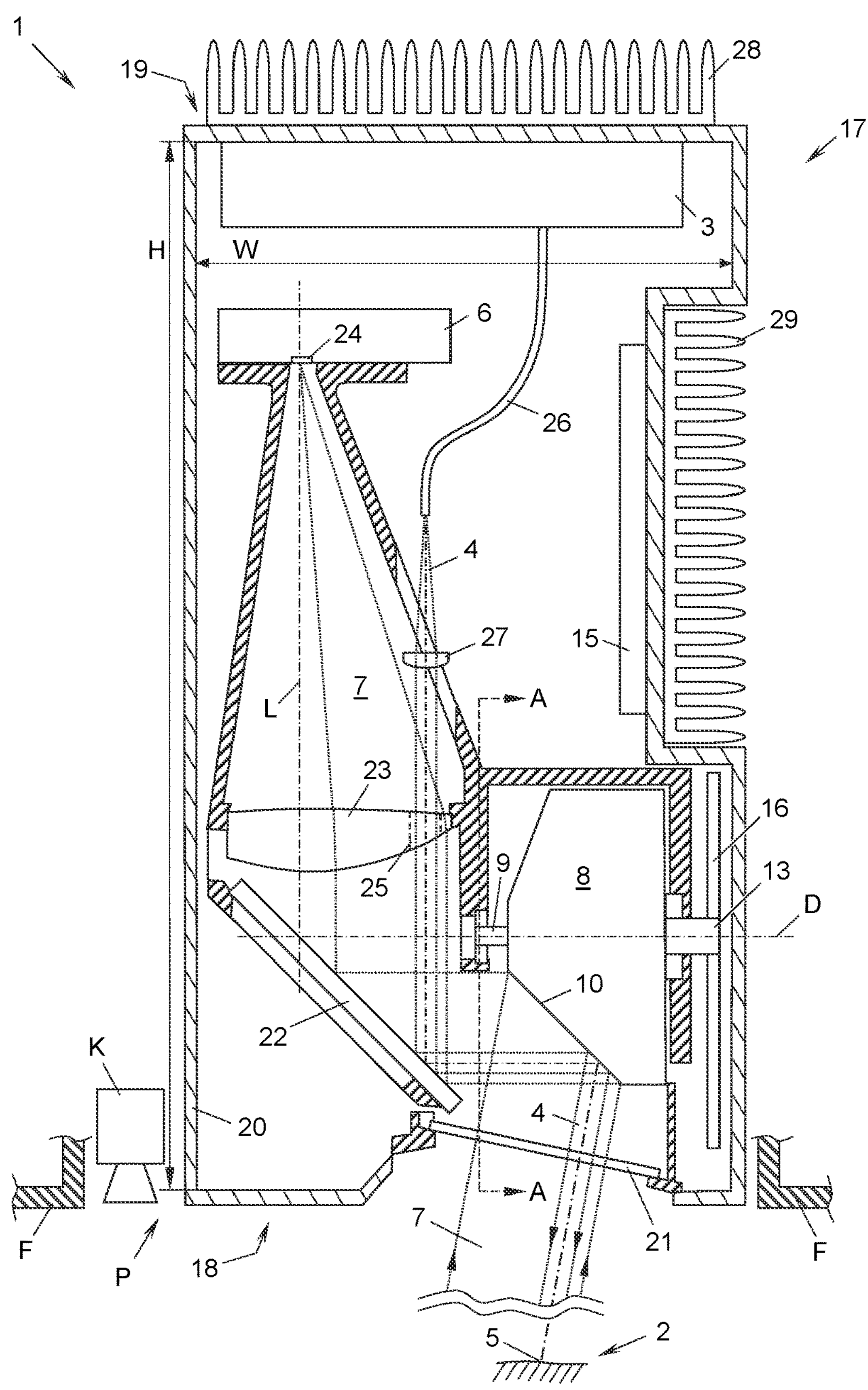
FIG. 1 shows an embodiment of a laser scanner according to the disclosed subject matter in a longitudinal section in the plane of its transmission beam.

FIG. 1 shows a laser scanner 1 for scanning an environment 2. In this case, the laser scanner 1 can be mounted either on a frame or the like for stationary scanning or on a vehicle F for mobile scanning, in particular on an aircraft for airborne scanning, for example in or behind an aperture P provided for this purpose, for example in a hatch in the outer wall or the like. Further measuring and recording apparatuses, e.g. a camera K, etc., can use the same aperture P, if desired, for simultaneously measuring the environment.

The laser scanner 1 comprises a laser transmitter 3, which transmits a pulsed or modulated transmission beam 4, which impinges on the environment 2 at a respective impinging point 5 and is reflected thereby at least in part, and a laser receiver 6, which receives the transmission beam 4 reflected by the environment 2 as a receive beam 7. A beam-deflection device 8 of the laser scanner 1 is arranged in the beam path of the transmission and receive beams 4, 7. The beam-deflection device 8 is a mirror pyramid that is mounted on a shaft 9 so as to be rotatable about a rotational axis D and has pyramid sides inclined relative to the rotational axis D that each form a mirror facet 10-12. In the example shown, the mirror pyramid has three mirror facets 10-12 or pyramid sides, and alternatively it can have four or more pyramid sides. Either all the mirror facets have the same inclination relative to the rotational axis D or at least two of said mirror facets, or even all the mirror facets, have inclinations relative to the rotational axis D that are different from one another.

Figure 2:
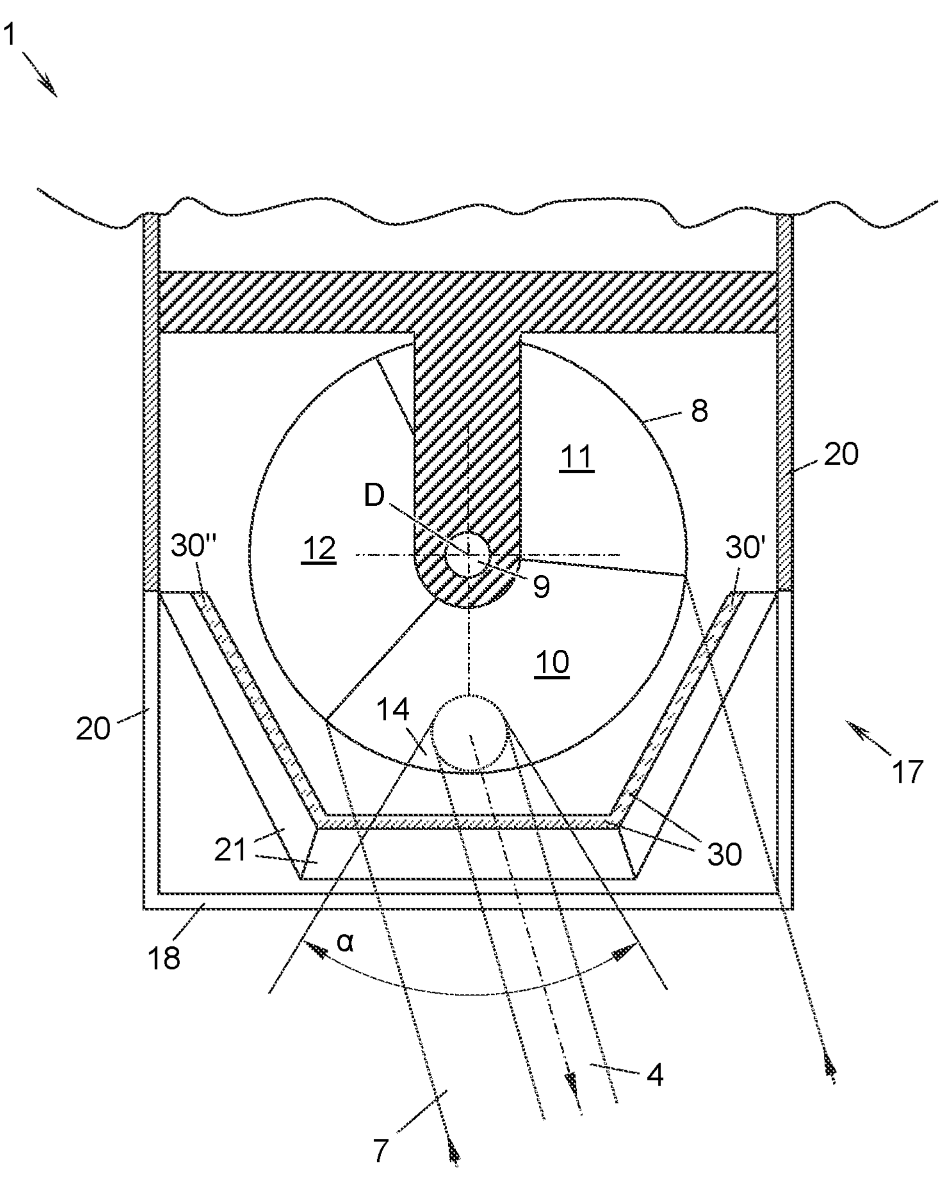
FIG. 2 is a detail of the laser scanner from FIG. 1 along a sectional line A-A.

It goes without saying that the mirror pyramid can have any pyramid shape having any polygonal base, specifically both straight and oblique, with the pyramid axis not being perpendicular to the base, can be regular or irregular, pointed or truncated (truncated pyramid), and can be cut away at the tip and/or base, like the pyramid shown in FIGS. 1 and 2, the base of which is cut away to be circular in order to reduce the air resistance when it rotates.

The shaft 9 of the mirror pyramid is driven by a motor 13, such that the transmission beam 4 impinges on an active mirror facet 10-12 in each case, i.e. the mirror facet 10-12 that is currently in the beam path of the transmission and receive beams 4, 7. In the example shown, the transmission beam 4 impinges on the respectively active mirror facet 10-12 immediately beside the outer edge of the mirror pyramid. The receive beam 7 impinges on the entire active mirror facet 10-12, and specifically exactly from the direction in which the transmission beam 4 was transmitted. Because of the rotational movement of the mirror pyramid, the transmission beam 4 is periodically pivoted through a scan angle $\alpha$ to form a fan-shaped scanning beam 14 (FIG. 2). By means of the fan-shaped scanning beam 14, the environment 2 is scanned line by line, in particular point by point in lines.

An electronic unit 15 controls the laser scanner 3 and evaluates received signals from the laser receiver 6 in order to determine a propagation time of the transmission and receive beams 4, 7 therefrom. The electronic unit 15 further controls the rotational movement of the motor 13 or beam-deflection device 8, optionally by means of a motor controller 16. From the determined propagation time, the electronic unit 15 can determine the distance between the laser scanner 1 and the impinging point 5 of the transmission beam 4 on the environment 2 and, from the position of the active mirror facet 10-12 when the transmission beam 4 is transmitted, can determine the direction of the impinging point 5 from the viewpoint of the laser scanner 1, as is known from the prior art. From this, either the electronic unit 15 or an arithmetic logic unit that is separate from the laser scanner 1 can calculate the position of the impinging point 5 relative to the laser scanner 1 and can optionally generate a 3D point cloud or 3D model of the environment 2 from a plurality of impinging points in a known manner.

The laser scanner 1 further comprises a housing 17, in which the laser transmitter 3, the laser receiver 6, the beam-deflection device 8, and other components, e.g. the electronic unit 15, the motor 13, its optional motor controller 16, etc., are arranged. The housing 17 is, for example, cylindrical or prismatic having a bottom face and a top face 18, 19 and a lateral shell 20 which connects said faces, and said housing is elongated, such that the lateral shell 20 has an inner width W that is smaller than the housing height H between the bottom face and top face 18, 19. The elongated housing 17 does not necessarily have a completely regular shape, but instead can have, for example, indentations, projections, etc., and additional openings, e.g. for ventilation.

The housing 17 has a window 21 in its bottom face 18 for the transmission and receive beams 4, 7. The beam-deflection device 8 is arranged in the housing 17 so as to be adjacent to the window 21, and specifically such that its rotational axis D is oriented substantially in parallel with the bottom face 18, i.e. the bottom surface 18 could, on one hand, only be planar in portions and the rotational axis D could only be parallel to one of the portions, and the rotational axis D can, on the other hand, optionally have a slight inclination relative to the bottom face 18 or its portions in the order of a few angular degrees.

A deflecting mirror 22 is further arranged in the housing 6 so as to be adjacent to the bottom face 18. The deflecting mirror 22 deflects the receive beam 7 coming from the beam-deflection device 8 onto the laser receiver 6, which is arranged closer to the top face 19 than to the bottom face 18 in the housing 17, i.e. in the direction of the top face 19, and specifically, in the embodiment shown, by an angle of approximately 90°, and in other embodiments by an angle of between 70° and 110°. The interaction of the deflecting mirror 22 with the beam-deflection device 8 brings about a Z-shaped fold in the receive beam 7 in the interior of the housing 17, which facilitates a narrow housing shape.

In principle, the laser receiver 6 could be of any type known in the art, for example a large-format photosensitive sensor, a CCD chip, etc. In the example shown, an optional optical receiving system 23 is arranged in the housing 17 in the beam path between the beam-deflection device 8 and the laser receiver 6 to focus the receive beam 7 on the laser receiver 6, i.e. either between the beam-deflection device 8 and the deflecting mirror 22 or, as in the example of FIG. 1, between the deflecting mirror 22 and the laser receiver 6. For this purpose, the laser receiver 6 has a light sensor 24 arranged in the focus of the optical receiving system 23, for example a photomultiplier or an avalanche photodiode. The optical receiving system 23 can contain one or more mirrors, diffractive and/or refractive optical elements. In the example shown, the optical receiving system 23 is an optical lens. This lens optionally has a decentralized optical axis L, such that the receive beam 7 is also focused in a decentralized manner and the laser receiver 6 or its light sensor 24 is arranged in the housing 17 in a decentralized manner above the deflecting mirror 22.

According to FIG. 1, the transmission beam 4 impinges on the beam-deflection device 8 in parallel with the rotational axis D, i.e. the mirror facet 10 that is active here. This results in a largely straight scan line. Alternatively, the transmission beam 4 can be at least slightly inclined relative to the rotational axis D. The transmission beam 4 can, in each case, impinge on the beam-deflection device 8 without further folding, for example past or through the deflecting mirror 22, e.g. through an opening therein (not shown). For this purpose, the laser transmitter 3 can be arranged behind the deflecting mirror 22 from the viewpoint of the beam-deflection device 8, or the transmission beam 4 can be guided behind the deflecting mirror 22 by means of an optical waveguide, for example, and the laser transmitter 3 can be arranged elsewhere in the housing 17 in this case.

In the embodiment shown, however, the deflecting mirror 22 not only deflects the receive beam 7 from the beam-deflection device 8 onto the laser receiver 6, but also deflects the transmission beam 4 from the laser transmitter 3 onto the beam-deflection device 8. In this case, the optical lens has a cut-out (here, a hole) 25, which is in parallel with its optical axis L and is spaced apart from the optical axis L, for the transmission beam 4 to pass through in parallel with the optical axis L and in an uninterrupted manner, and specifically irrespective of whether the optical receiving system 23 is arranged upstream or downstream of the deflecting mirror. A cut-out of this kind can also be provided when using a mirror as an optical receiving system 23, for example.

In the example in FIG. 1, when viewed from the deflecting mirror 22, the laser transmitter 3 is arranged behind the laser receiver 6, and specifically right on the top face 19 of the housing 17. In this case, the transmission beam 4 is guided from the laser transmitter 3, past the laser receiver 6 and to the cut-out 25 by means of an optical waveguide 26. A collimator lens 27 is optionally arranged at the exit side of the optical waveguide. Instead of the optical waveguide 26, the transmission beam 4 could be guided past the laser receiver 6 to the cut-out 25 by means of one or more mirrors, for example, and/or the laser transmitter 3 could be arranged elsewhere in the housing 17, even in the receive beam 7, e.g. if the laser transmitter 3 is a very small semiconductor laser.

The housing 17 optionally has a cooling body 28 on the outside of its top face 19. In the example in FIG. 1, the housing 17 further bears an optional further cooling body 29 for the electronic unit 15 on the outside of the lateral shell 20.

As shown in FIG. 2, the window 21 can not only be planar, but alternatively, when viewed in the direction of the rotational axis D, it can have the cross section of an arc of a circle or an arc of an ellipse, or (in the case shown here) of an open polygon 30. In this case, the rotational axis D is in the interior of the polygon 30, i.e. on its concave side, at least part of the mirror pyramid projecting between the outer legs 30', 30" of the polygon 30 or between the ends of the arc of the circle or the arc of the ellipse.

The disclosed subject matter is not limited to the embodiments set out, but instead covers all the variants, modifications, and the combinations thereof that fall within the scope of the accompanying claims.

What is claimed is:

1. A laser scanner for scanning of an environment, comprising:

a laser transmitter for transmitting a transmission beam, a laser receiver for receiving the transmission beam reflected by the environment as a receive beam, a beam-deflection device arranged in a beam path of the transmission and receive beams in the form of a mirror pyramid that is rotatable about a rotational axis and has pyramid sides inclined relative to the rotational axis that each form a mirror facet, and a housing, in which the laser transmitter, the laser receiver, and the beam-deflection device are arranged and which comprises a bottom face and a top face, a lateral shell which connects the bottom face and top face and has an inner width that is less than a housing height between the bottom face and top face, and a window for the transmission and receive beams, wherein the window is in the bottom face, the beam-deflection device is adjacent to the window and the rotational axis is oriented substantially in parallel with the bottom face, and the laser receiver is arranged closer to the top face than to the bottom face, a deflecting mirror being arranged in the housing so as to be adjacent to the bottom face and deflecting the receive beam from the beam-deflection device onto the laser receiver, wherein the transmission beam impinges on the beam-deflection device in parallel with the rotational axis of the beam-deflection device.

2. The laser scanner according to claim 1, wherein an optical receiving system is arranged in the housing in the beam path between the beam-deflection device and the laser receiver to focus the receive beam on the laser receiver.

3. The laser scanner according to claim 2, wherein the optical receiving system is arranged between the deflecting mirror and the laser receiver.

4. The laser scanner according to claim 2, wherein the optical receiving system is an optical lens having a decentralized optical axis.

5. The laser scanner according to claim 4, wherein the deflecting mirror further deflects the transmission beam from the laser transmitter onto the beam-deflection device, the optical lens having a cut-out, which is in parallel with said optical axis and spaced apart therefrom, for the transmission beam to pass through.

6. The laser scanner according to claim 5, wherein, when viewed from the deflecting mirror, the laser transmitter is arranged on the top face behind the laser receiver, the transmission beam being guided from the laser transmitter, past the laser receiver and to the cut-out by means of an optical waveguide.

7. The laser scanner according to claim 1, wherein, when viewed in the direction of the rotational axis, the window has the cross section of an arc of a circle or an arc of an ellipse, or of an open polygon, in an interior of which the rotational axis is positioned.

8. The laser scanner according to claim 1, wherein the mirror facets each have inclinations relative to the rotational axis that are different from one another.

9. The laser scanner according to claim 1, wherein the housing has a cooling body on the outside of the top face.

* * * * *